United States Patent [19]

Shoji et al.

[11] Patent Number: 4,714,841
[45] Date of Patent: Dec. 22, 1987

[54] DOUBLE-SIDED LOGIC INPUT DIFFERENTIAL SWITCH

[75] Inventors: Norio Shoji, Tokyo; Masashi Takeda, Kanagawa, both of Japan

[73] Assignee: Sony Corporation, Tokyo, Japan

[21] Appl. No.: 748,596

[22] Filed: Jun. 25, 1985

[30] Foreign Application Priority Data

Jun. 30, 1984 [JP] Japan .................................. 59-136236

[51] Int. Cl.[4] ................. H03K 19/086; H03K 19/092; H03K 19/003; H03K 17/60
[52] U.S. Cl. .................................... 307/455; 307/475; 307/356; 307/355; 307/261; 307/272.1
[58] Field of Search ............... 307/475, 455, 264, 443, 307/445, 464, 355, 356, 357, 289, 272 R, 272 A; 330/252, 261

[56] References Cited

U.S. PATENT DOCUMENTS

| | | | |
|---|---|---|---|
| 3,636,384 | 1/1972 | Dewitt | 307/455 X |
| 3,925,691 | 12/1975 | Gaskill, Jr. et al. | 307/455 |
| 4,137,468 | 1/1979 | Bosch | 307/264 X |
| 4,587,444 | 5/1986 | Emori et al. | 307/455 |

OTHER PUBLICATIONS

Weiss, "Double-Sided Logic Current Switch", IBM Technical Disclosure Bulletin, vol. 13, No. 1, p. 8, Jun. 1970.

Hockedy et al., "Threshold Detector Latch", IBM Technical Disclosure Bulletin, vol. 13, No. 6, p. 1732, Nov. 1970.

Primary Examiner—Stanley D. Miller
Assistant Examiner—David R. Bertelson
Attorney, Agent, or Firm—Lewis H. Eslinger; Alvin Sinderbrand

[57] ABSTRACT

A logic circuit adapted for fabrication as an integrated circuit is formed having a differential amplifier operating with a constant current source and an appropriate voltage source, and having output transistors to provide the necessary output voltages, does not require a reference voltage input to the differential amplifier, thus, reference voltage transistors are not required. The two binary input signals are selected to have the same amplitude difference between the high and low levels thereof and one of the two input signals is shifted relative to the other one by the amount substantially equal to ½ the selected amplitude difference, and the output signals are similarly level shifted. Using this basic logic circuit as a building block other, more complex, logic circuits can be obtained.

20 Claims, 26 Drawing Figures

Fig. 10
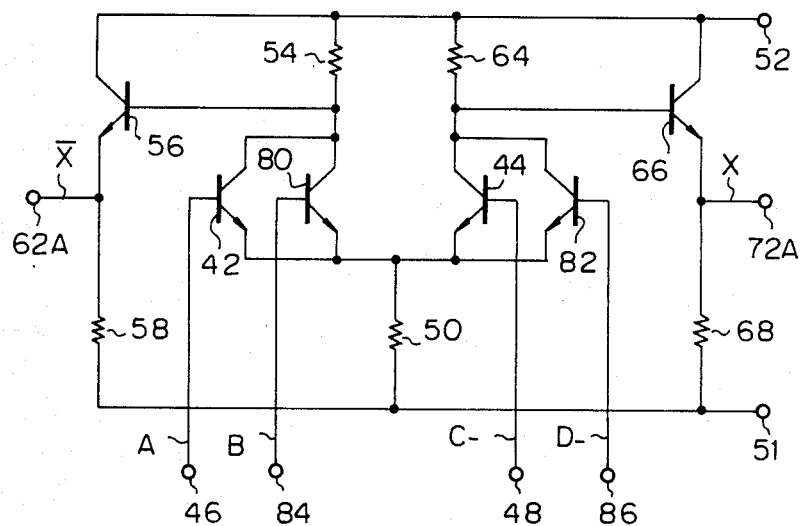
Fig. 11
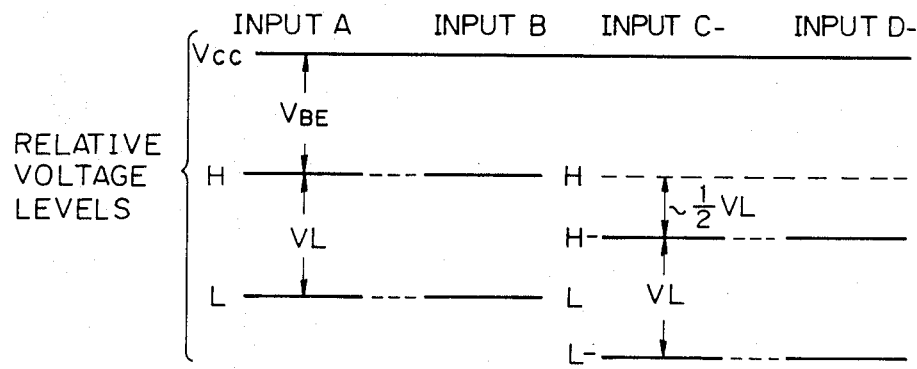
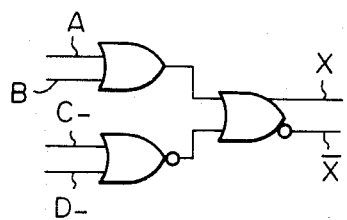
Fig. 12

DOUBLE-SIDED LOGIC INPUT DIFFERENTIAL SWITCH

BACKGROUND OF THE INVENTION

Field of the Invention

This invention relates generally to a logic circuit of the differential amplifier kind for performing logic operations on binary input signals and, more particularly, to a logic circuit particularly adapted for integrated circuit fabrication in which a separate reference voltage generating element is not required for the differential amplifier circuit.

Description of the Prior Art

The particular requirements of integrated circuit fabrication have forced changes in the design of various logic circuits from their original, discrete-component designs. For example, the constraints on such logic circuit designs placed by the integrated circuit fabrication techniques have resulted in the use of differential amplifiers and constant current sources as a fundamental building block for such logic circuits, and this kind of logic circuitry is typically referred to as emitter coupled logic (ECL). Representative of this technology is U.S. Pat. No. 3,259,761. Central to such ECL differential amplifier logic, is the requirement for a reference voltage generator to provide the necessary reference voltage against which the input signals are compared. Further, in order to provide high-speed logic circuits, the current that must flow through each logic circuit is necessarily large relative to the quiescent state, and accordingly the number of reference voltage generators must correspond roughly to the scale of the logic circuit, so that they are capable of absorbing the transient currents produced upon switching the various transistors making up the ECL logic circuit. Due to such reference voltage requirements, it is the commonly known technique to employ three transistors to realize a two-input OR gate in the ECL differential amplifier configuration.

Accordingly, the presently known conventional logic circuits have an inherent disadvantage in that they require a relatively large number of circuit elements. Moreover, because of the requirement to employ the reference voltage an additional wiring pattern for each logic circuit is required and a further disadvantage is present because the ratio of the area of the wiring pattern on the substrate is large, and this leads to corresponding increases in chip size.

OBJECTS AND SUMMARY OF THE INVENTION

Accordingly, it is an object of the present invention to provide a logic circuit for fabrication as an integrated circuit that can eliminate the above-noted disadvantages inherent in the prior art.

Another object of this invention is to provide a logic circuit that requires no reference voltages or reference voltage generators, whereby the number of circuit elements such as transistors and resistors is reduced, with a corresponding reduction in power consumption and a reduction in operating time.

In accordance with an aspect of the present invention, the differential amplifier is constructed whereby the value of the constant current source therefor is made relatively small, yet an operating speed substantially the same as that of conventional emitter coupled logic is obtained. Thus, not only is the number of circuit elements reduced but the power consumption required thereby is also reduced.

By eliminating the requirement for the reference voltages and the corresponding reference voltage generators for each of the various gate circuits forming the particular logic circuit, the wiring pattern used to supply such reference voltage is eliminated as well and the integrated circuit chip size can be reduced accordingly.

The present invention, thus, provides a technique for forming a logic circuit in which the emitters of first and second transistors are connected to a constant current source and in which a first input terminal receiving the first binary input signal is connected to the base of the first transistor and a second input terminal receives the second binary input signal and is connected to the base of the second transistor, the output terminal of the logic circuit is then obtained from one or the other of the collectors of the first and second transistors. The circuit is constructed so that the amplitude or voltage difference between a low level and a high level of the first binary input and of the second binary input are selected to be equal, and one of the first or second binary inputs is shifted in level relative to the other by an amount equal to ½ of such selected amplitude, the output circuit then provides similarly level shift signals, all of which have the same absoulte amplitude difference.

The above and other objects, features, and advantages of the present invention will become apparent from the following detailed description of illustrative embodiments thereof to be read in conjunction with the accompanying drawings, in which like reference numerals refer to like elements.

Figure 5:
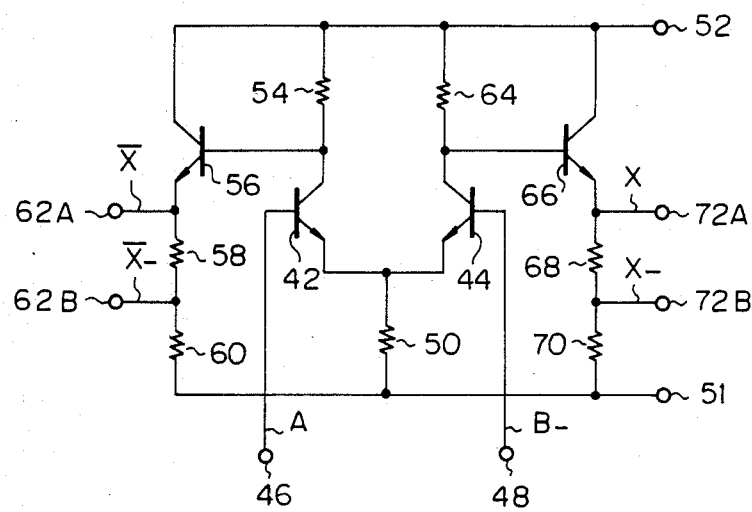
Figure 6:
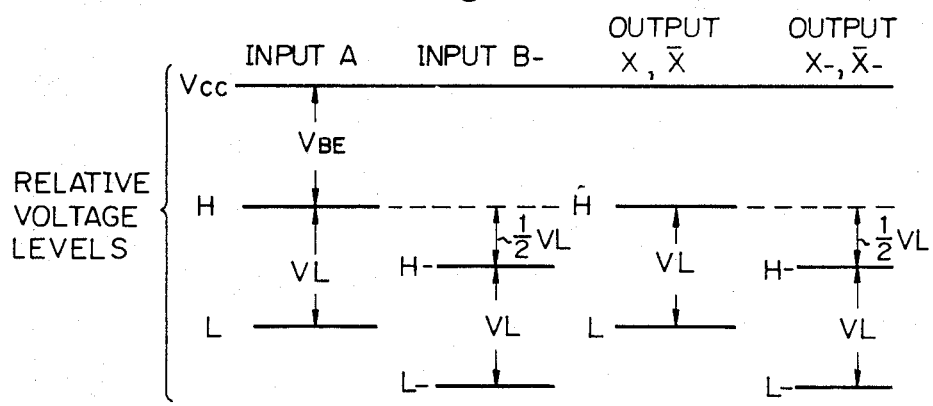
Figure 7:
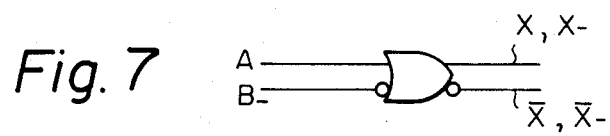
Figure 8:
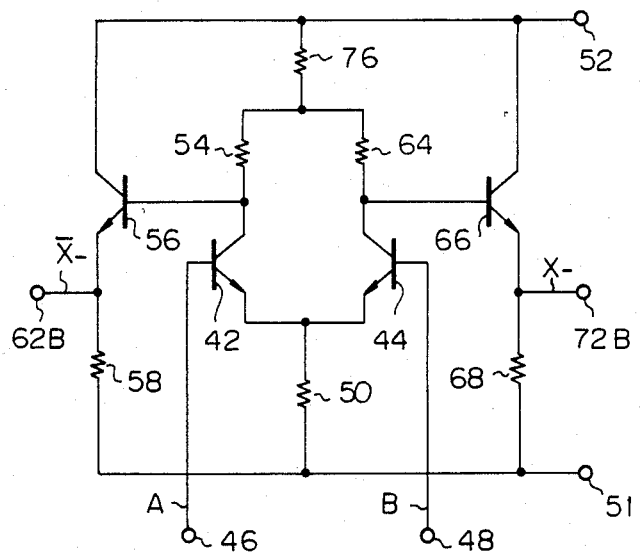
Figure 9:
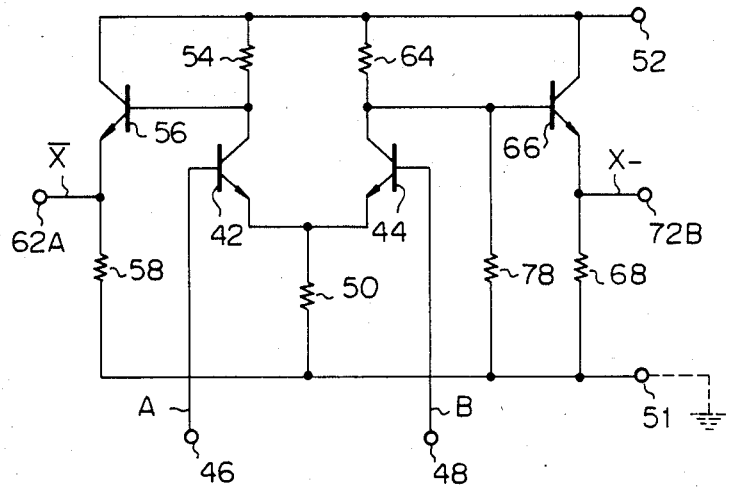
Figure 13:
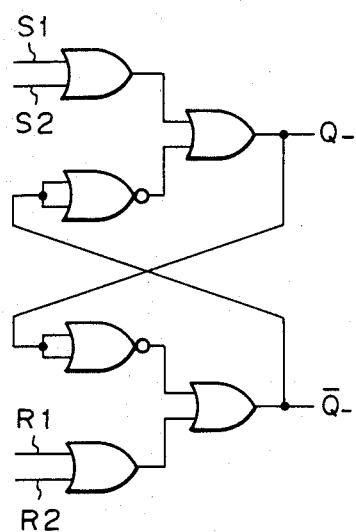
Figure 14:
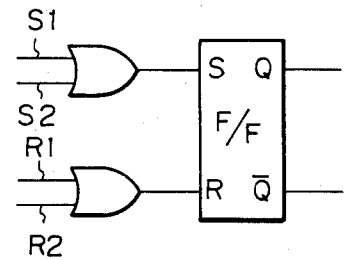
Figure 15:
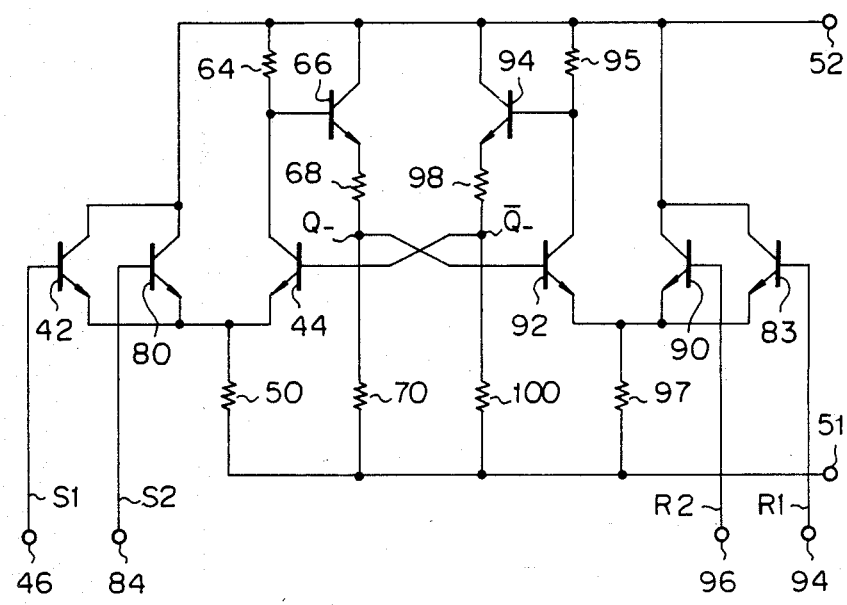
Figure 16:
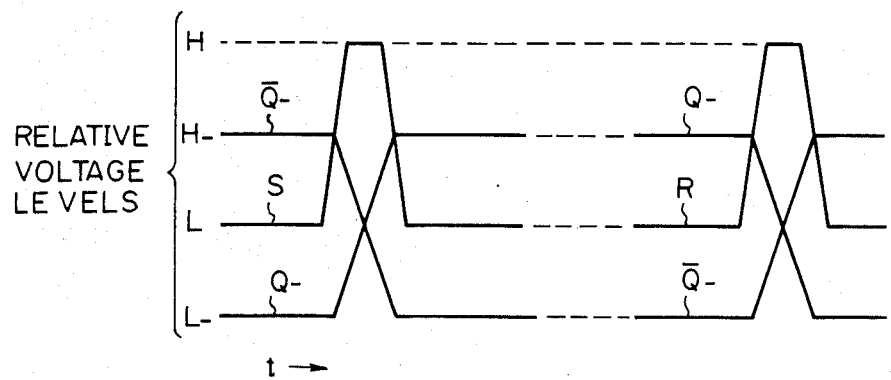
Figure 17:
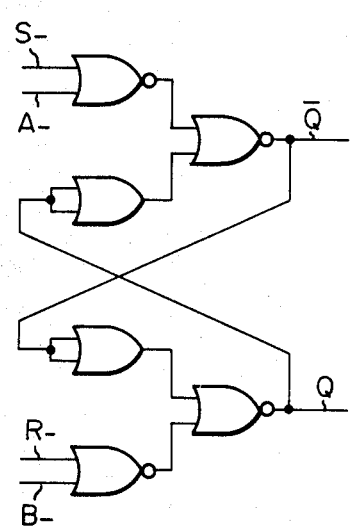
Figure 18:
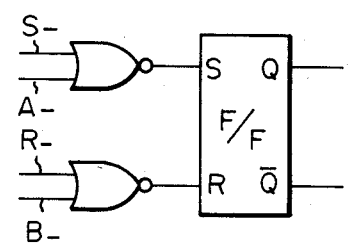
Figure 19:
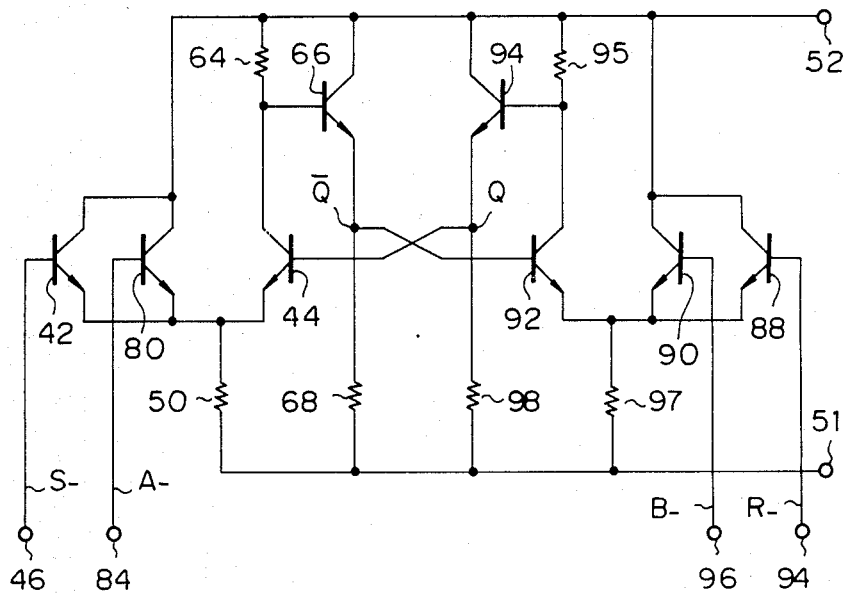
Figure 20:
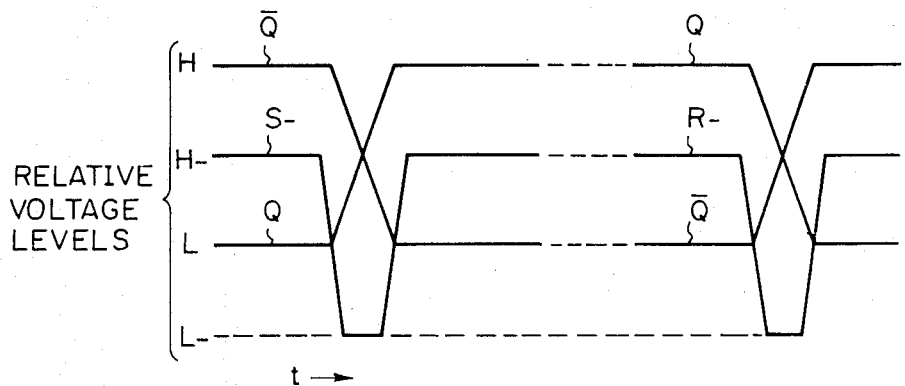
Figure 21:
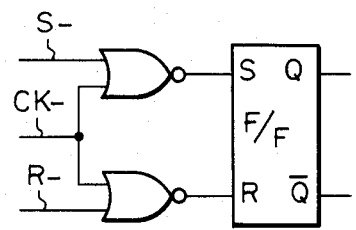
Figure 22:
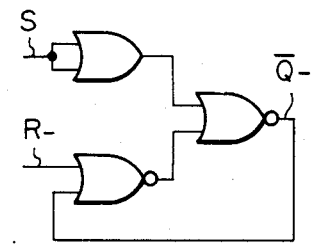
Figure 23:
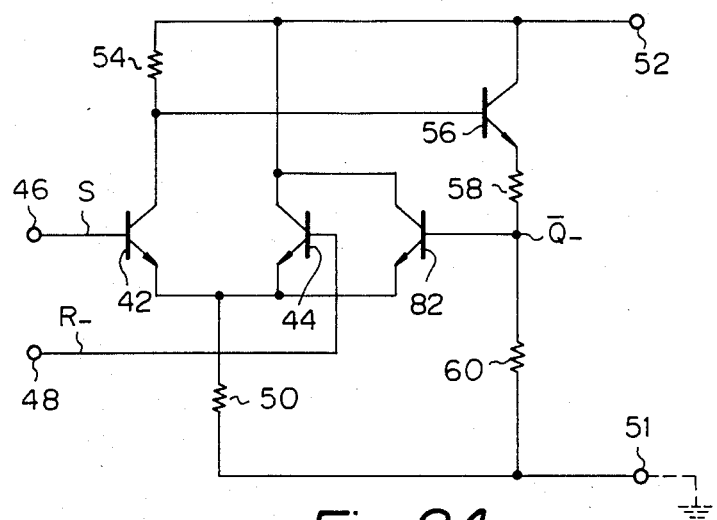
Figure 24:
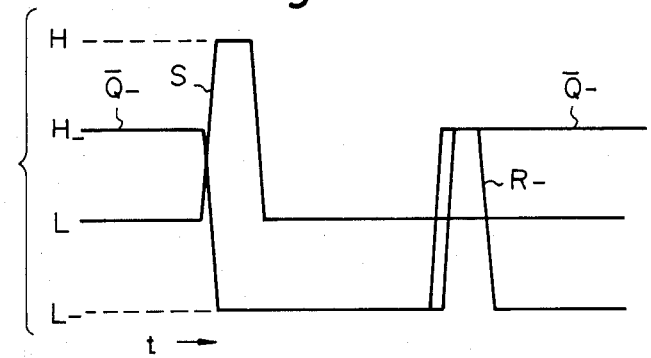
Figure 25:
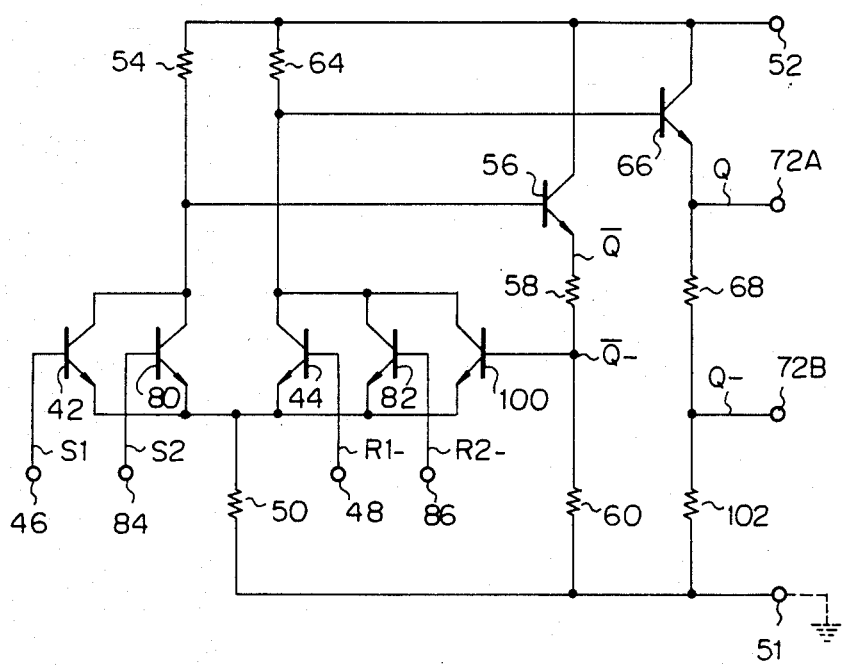
Figure 26:
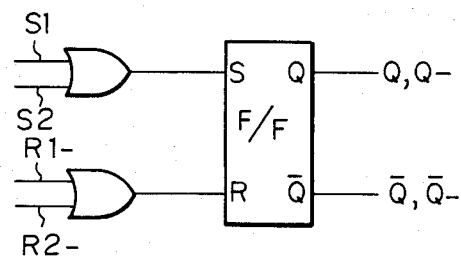

FIG.. 4 is a representation of a R-S flip flop known in the prior art;

FIG. 5 is a schematic diagram of an embodiment of a logic circuit according to the present invention;

FIG. 6 is a representation of relative voltage levels employed in the circuit of FIG. 5;

FIG. 7 is a representation of a two-input logic circuit obtainable from the embodiment of FIG. 5;

FIG. 8 is a schematic diagram of another embodiment of a logic circuit according to the present invention;

FIG. 9 is a schematic diagram of a further embodiment of a logic circuit according to the present invention;

FIG. 10 is a schematic diagram of still a further embodiment of a logic circuit according to the present invention;

FIG. 11 is a representation of relative voltage levels employed in the circuit of FIG. 10;

FIG. 12 is a representation of logic circuit elements that are obtainable by the embodiment of FIG. 10;

FIG. 13 is a representation of an R-S flip flop that is obtainable by an embodiment of the present invention;

FIG. 14 is a representation of logic circuit elements that may be functionally obtained by an embodiment of the present invention;

FIG. 15 is a schematic diagram of an R-S flip flop according to an embodiment of the present invention;

FIG. 16 is a timing chart showing voltage waveforms useful in explaining the operation of the R-S flip flop of FIG. 15;

FIG. 17 is a representation of an R-S flip flop that is obtainable by an embodiment of the present invention;

FIG. 18 is another representation of the logic circuit elements forming an R-S flip flop as shown in FIG. 17;

FIG. 19 is a circuit diagram of an R-S flip flop as shown in FIG. 18 according to another embodiment of the present invention;

FIG. 20 is a waveform diagram showing relative voltage levels present in the R-S flip flop of FIG. 19;

FIG. 21 is a representation of logic circuit elements forming an R-S flip flop that may be functionally obtained by another embodiment of the present invention;

FIG. 22 is a representation of logic circuit elements forming an R-S flip flop that is functionally obtainable according to an embodiment of the present invention;

FIG. 23 is a circuit diagram of an R-S flip flop according to another embodiment of the present invention;

FIG. 24 is a waveform diagram showing relative voltage levels of the R-S flip flop of FIG. 23;

FIG. 25 is a circuit diagram of an R-S flip flop according to another embodiment of the present invention; and FIG. 26 is a representation of a logic circuit functionally obtainable according to the embodiment of FIG. 25.

DETAILED DESCRIPTION OF PREFERRED EMBODIMENTS

Figure 1:
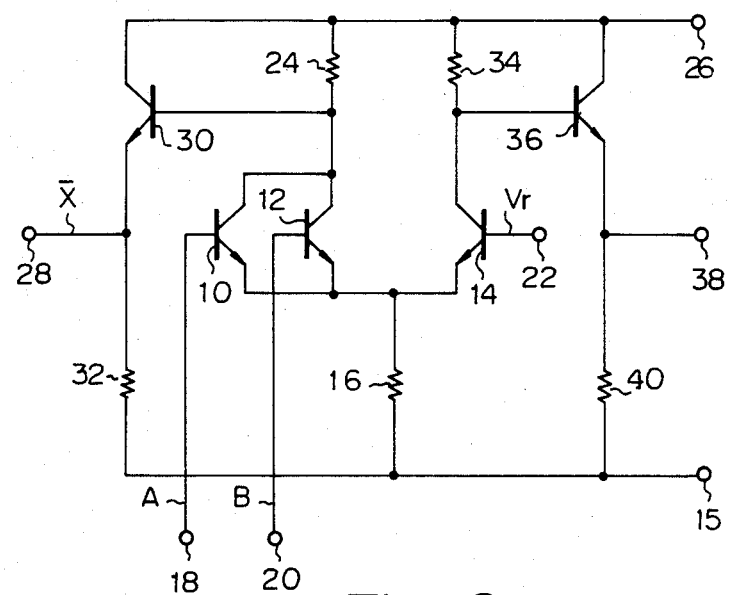
FIG. 1 is a schematic circuit diagram of an emitter coupled logic circuit known in the prior art.

As known in the prior art, emitter coupled logic circuits typically fabricated in an integrated circuit configuration require various reference voltage levels in order to make the logical comparisons. FIG. 1 is a circuit diagram of such prior art emitter coupled logic circuit, in which three transistors 10, 12, and 14 have respective emitters connected in common to a common or return line having terminal 15 through a resistor 16 that functions as a constant current source. One input signal terminal 18 is connected to the base lead connection of first transistor 10 and the other input signal terminal 20 is connected to the base lead of second transistor 12. The required reference voltage is then connected to the base lead of third transistor 14. The respective collector circuits of transistors 10 and 12 are connected together through resistor 24 to voltage source terminal 26, and such collectors also provide one output signal of the logic circuit at terminal 28 through an emitter-follower configuration transistor 30. The emitter-follower configuration of transistor 30 being accomplished by resistor 32 connected between the emitter lead of transistor 30 and the common or return line terminal 15. In reference voltage transistor 14, the collector circuit is connected through resistor 34 to the power source terminal 26 and is similarly connected to the base lead of transistor 36 that is also connected in emitter-follower configuration. The other ouput at terminal 38 is provided by emitter-follower transistor 36 across emitter resistor 40 connecting the emitter circuit of transistor 36 to return or common line terminal 15.

Figure 3:
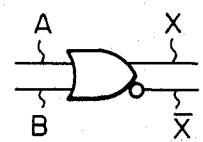
FIG. 3 is a representation of a two-input, two-output OR gate known in the prior art.

In the circuit of FIG. 1 and assuming that the inputs A and B at terminals 18 and 20, respectively, would be at substantially the same levels typically produced by such circuit at output terminals 28 and 38, the logic functions of this circuit are shown in FIG. 3, that is, this logic circuit functions as an OR gate and a NOR gate.

Figure 2:
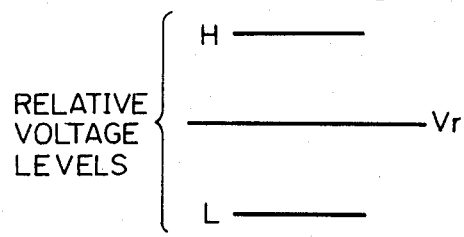
FIG. 2 is a representation of the relative voltage levels used in the circuit of FIG. 1.

The relative voltage levels of the high and low signal levels of the inputs at 18 and 20 in relation to the reference voltage $V_r$ applied to terminal 22 are shown in FIG. 2. In FIG. 2, it is seen that the relationship between the three voltage levels in the circuit of FIG. 1 is such that the reference voltage falls at the center between the high voltage level and low voltage level at inputs A and B. respectively. This voltage relationship results in the situation that when one of the inputs A or B is high, a current would then flow through either one of transistors 10 and 12 so that x=H and X=L.

Accordingly, it is seen in this known emitter coupled logic circuit three transistors are required at a minimum in order to constitute a logic element, such as an OR gate.

FIG. 5 is a schematic diagram of a logic circuit according to an embodiment of the present invention in which transistors 42 and 44 comprise a pair forming a differential amplifier. A first input terminal 46 receives a first binary input signal A that is fed to the base circuit of transistor 44, and a second input terminal 40 receives a second binary input B— and that is fed to the base circuit of second transistor 44. The constant current source is provided by resistor 50 that is connected between the common emitter connection of transistors 42 and 44 and a common or return line having terminal 51. The collector circuit of transistor 42 is connected to the appropriate source voltage terminal 52 through a resistor 54, and the collector circuit of transistor 42 is also connected to the base lead of an emitter-follower transistor 56. Emitter-follower transistor 56 has its emitter lead connected through series-connected resistors 58 and 60 to the common or return line having terminal 51 and one output terminal 62a ($\overline{X}$) is connected at the connection point of this emitter lead of emitter-follower transistor 56 and resistor 58 and a second output ($\overline{X}$—) is obtained from output terminal 62b at the connection point between resistors 58 and 60.

The collector circuit of transistor 44 is similarly connected to voltage source terminal 52 through resistor 64 and is also connected to a base lead of output transistor 66 that is connected in the emitter-follower configuration. Transistor 66 has emitter resistors 68 and 70 connected in series to the return line that can be connected at terminal 51 to electrical ground potential. Another output signal X is obtained at the connection between the emitter lead of transistor 66 and resistor 68 at terminal 72A, and the output X— may be obtained at terminal 72 connected at the node between resistors 68 and 70. As will be seen from the circuit of FIG. 5, resistors 60 and 70 comprise constant current source resistors for output transistors 56 and 66, respectively. Because this is a logic circuit having outputs and inputs that are balanced, resistors 54 and 64 will have the same values and, similarly, resistors 58 and 68 will also have the same values. The values of resistors 60 and 70 are selected so that the constant current provided thereby will have a magnitude approximately ½ that of the constant current provided by resistor 50.

The operation of the circuit of FIG. 5 is represented by the relative voltage levels of FIG. 6, in which inputs A and B— have the same amplitude differences VL between the high and low levels. Compared with input A, input B— has levels of H— and L—, which are shifted by an amount ½ VL from levels H and L, respectively. Thus, the relationships between resistors 60, 70, and 50 are seen. In regard to the absolute voltage levels, assuming that the source voltage applied at input terminal 52 is Vcc, and the voltage drop across the base and emitter of a transistor is VBE, then the relative levels are seen as follows:

$H = Vcc - VBE$ $L = Vcc - VBE - VL$ $H- = Vcc - VBE - \frac{1}{2}VL$ $L- = Vcc - VBE - VL - \frac{1}{2}VL$ For example, assuming that A=L and input B—=L—, then transistor 42 is turned ON and transistor 44 is turned OFF and a constant current I flows through transistor 42. The collector potential of transistor 42 then becomes (Vcc−IR), when the resistance value of resistor 54 is represented by R. Thus, output $\overline{X}$ present at output terminal 72A becomes (Vcc−IR−VBE) and, accordingly, when IR=VL, output $\overline{X}$ becomes L and because the resistance value of resistor 58 is selected as R and because the constant current due to resistor 60 is set to be ½ I, output $\overline{X}-$ at output terminal 72B will become (Vcc−IR−−VBE−½VL=L−).

Continuing with this example, the collector voltage of transistor 44 will be Vcc and the output X at terminal 72A will be (Vcc−VBE=H) whereas output X— at terminal 72B will be (Vcc−VBE−½VL=H−). The relationships between the levels of the inputs and outputs are seen to be identical, thereby preventing a potential troublesome problem when a plurality of such logic circuits are connected.

The relationships between the inputs and outputs in the embodiment of FIG. 5 relative to positive logic circuit are represented by the following table:

| A | B— | X | X— | $\overline{X}$ | $\overline{X}-$ |
|---|----|---|----|---|----|
| L | L— | H | H— | L | L— |
| L | H— | L | L— | H | H— |
| H | L— | H | H— | L | L— |
| H | H— | H | H— | L | L— |

The logic circuit provided by the embodiment of FIG. 5 is shown in conventional circuit design notation in FIG. 7. Moreover, in the practical situation both the positive output and negative output can be obtained and the fundamental logic circuits represented as AND, NAND, OR, and NOR can be realized by selecting from among the outputs X, X—, $\overline{X}$, and $\overline{X}-$. In further embodiments of the present invention, in order to obtain the desired level shift of ½ VL, the constant current source may be connected to the emitter of two emitter-follower configuration transistors or a circuit arrangement as represented in FIGS. 8 and 9 may be employed.

Referring then to FIG. 8, the collectors of transistors 42 and 44 are connected through collector resistors 54 and 64, respectively, that are connected in common to a current source resistor 76 having a magnitude selected as ½ R, based on resistor 54 being assigned the value R. Resistor 76 is then connected to the power source input at terminal 52. In the circuit of FIG. 8, output X— and $\overline{X}-$ having levels H— and L— can be obtained at output terminals 62B and 72B, respectively.

Similarly in FIG. 9, by connecting the emitter of the emitter-follower configuration transistors 56 and 66 to resistors 58 and 68, respectively, connected to the common line and connecting terminal 51 to ground, providing a resistor 78 as a constant current source between the collector of transistor 44 and the grounded return line, and by selecting the constant current that flows through resistor 78 to be ½ I, the output X can be obtained at terminal 62A and the output $\overline{X}-$ can be obtained at output terminal 72B.

Another embodiment of the present invention that can accept four binary input signals is shown in FIG. 10 in which transistors 42, 44, and 80, 82 comprise a differential amplifier, a first input A applied at terminal 46 is connected to the base lead of transistor 42 and a second input B supplied at terminal 84 is applied to the base lead of transistor 80. A third input C— is supplied at terminal 48 and applied to the base lead of transistor 44 and a fourth input D— is supplied at terminal 86 and is fed to the base lead of fourth transistor 82. The collectors of transistors 42 and 80 are connected in common to the base of emitter-follower output transistor 56 and are also connected through resistor 54 to the voltage source at terminal 52. Output terminal 62A provides $\overline{X}$ taken from the emitter lead of emitter-follower transistor 56, and the collector leads of transistor 44 and 82 are connected in common and at such connection point the base lead of output transistor 66 is connected. The common collectors of transistors 44 and 82 are then connected through resistor 64 to the voltage source at terminal 52. Output X is taken off at the emitter of transistor 66 at terminal 72A.

In order to better represent the relationships among the voltage levels of the four inputs and two outputs of the circuit of FIG. 10, attention is directed to FIG. 11, in which inputs A and B are binary signals each having possible amplitude levels L and H and inputs C— and D— are also binary signals having possible amplitude levels L— and H—. The signals A and B have the same logic amplitude, as do the binary signals C— and D—. Additionally, there is a difference of ½ VL between the corresponding levels of the pair of signals A and B and the pair of signals C— and D—.

When the embodiment of FIG. 10 is represented as employing positive logic, the functional equivalent of the logic circuit of FIG. 12 can be obtained. The corresponding relationship between the inputs and outputs of the circuit of FIG. 12 may be easily determined from the following table.

| A | B | C— | D— | X | $\overline{X}$ |
|---|---|----|----|---|---|
| L | L | L— | H— | L | H |
| L | L | H— | L— | L | H |
| L | L | H— | H— | L | H |
| L | H | H— | H— | H | L |
| H | L | H— | H— | H | L |
| . | . | . | . | . | . |
| . | . | . | . | . | . |
| . | . | . | . | . | . |

Other combinations of inputs that are not shown in the above table are also possible, in which for example, X=H and $\overline{X}$=L. That is, when both of the inputs A and B are at level L and either one of inputs C— and D— is at level H— transistors 42 and 80 are turned OFF and either one of transistors 44 and 82 is turned ON, so that X=L and $\overline{X}$=H. This logic relationship is, of course, different from the OR and NOR functions which are obtainable using conventional emitter-coupled logic.

Figure 4:
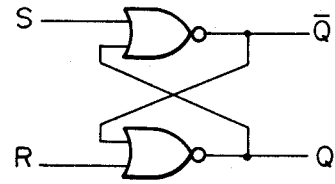

As indicated hereinabove, the present invention can also provide in addition to the above described logic elements an R-S flip flop. Such flip flop being of the kind known in the prior art and shown in FIG. 4 as typically comprising two "NOR" gates. Referring back to FIG. 4 it is seen that a conventional R-S flip flop can be constituted by two ECL NOR gates and a set input S is supplied to an input of one NOR gate, a reset input R is supplied to one input of the other NOR gate, and the outputs of the two NOR gates are connected to the remaining inputs of the respectively opposite NOR gates, with the outputs of the two NOR gates representing the circuit outputs. In conventional emitter-coupled logic, each of the NOR gates of the prior art R-S flip flop of FIG. 4 is embodied in accordance with the circuit of FIG. 1 and requires an input reference voltage and a reference voltage transistor.

An R-S flip flop can be realized according to the present invention by combining two of the logic circuits as shown in FIG. 12 in the manner shown in FIG. 13. In which case, two set inputs S1 and S2 are fed to one OR gate and two reset inputs R1 and R2 are supplied to the other OR gate. An output Q— of one logic circuit is supplied to another of the OR gates of the embodiment of FIG. 12, as is the output $\overline{Q}$— from the other logic circuit. Accordingly, it is seen that in this fashion an R-S flip flop is easily constituted.

An equivalent representation of the circuit of FIG. 13 is shown in FIG. 14 in which the NOR gates comprising the flip flop are represented in general by a flip flop F/F, and the remaining input OR gates are connected to the set input S and reset input R of the R-S flip flop F/F. Therefore, the present invention is quite suitable for applications involving a plurality of set inputs or reset inputs fed to a flip flop.

The circuit of FIG. 13 is shown in more detail in FIG. 15 in which one logic circuit is formed of transistors 42, 80, 44, and 66, while the other logic circuit is provided by transistors 88, 90, 92, and 94. Transistors 42, 80, and 44 comprise a differential amplifier in which one set input S1 supplied to terminal 46 is connected to the base lead of transistor 42 and the other set input S2 supplied at input terminal 84 is supplied to the base lead of transistor 80. Similarly, a second differential amplifier is comprised of transistor 88, 90, and 92 and a first reset input R1 supplied to input terminal 94 is applied to the base lead of transistor 88 and a second reset input R2 supplied to input terminal 96 is applied to the base lead of transistor 90. A constant current similar to that provided by resistor 50 is provided by resistor 97. The collector output of transistor 44 is connected to the base lead of a emitter-follower transistor 66 and is level shifted by operation of emitter resistor 68 and is also connected to the base lead of transistor 92. Similarly, the collector output of transistor 92 is fed to the base lead of an emitter-follower transistor 94, is level shifted by resistor 98, and is fed to the base lead of transistor 44. The output Q— is then obtained at the node between emitter-follower resistors 68 and 70 and the output $\overline{Q}$— is obtained at the node between emitter-follower resistors 98 and 100. These outputs could also be obtained directly at the emitter lead of transistors 66 and 94, respectively, in which case the level of each output would be larger by ½ VL than the outputs that would be obtained in the circuit of FIG. 15.

The timing of the R-S flip flop of FIG. 15 is shown in FIG. 16 in which it is seen that when the set input S1 or S2 rises from lower level L to the higher level H, the flip flop is reset and transistor 42 or 80 is turned ON and transistor 44 is turned OFF. Accordingly, output Q— will rise from the low level L— to a relatively higher level H— and transistor 92 in the second differential amplifier will be turned ON and transistor 88 and 90 in such differential amplifier will be turned OFF. Thus, output $\overline{Q}$— falls from the relatively high level H— to the lower level L—. This state will be held then even if the set input S1 or S2 falls to a low level L. When the reset input R1 or R2 rises from the low level L to the high level H in the set state, transistor 88 or 90 in the second differential amplifier is turned ON and transistor 94 is turned OFF. Thus, output $\overline{Q}$— rises from the relative low level L— to the relative high level H— and transistor 44 of the first amplifier is turned ON and transistors 42 and 80 are turned OFF, thereby output Q— falls from high level H— to the low level L—. It is seen then that this reset state will be held even if the reset input R1 or R2 assumes the low level L.

Another embodiment that is possible according to the present invention that is similar to that shown in FIG. 13 is shown in FIG. 17. In the R-S flip flop of FIG. 17, a set input S— and a set input control signal A— are supplied to the inputs of a NOR gate of one of the logic circuits, while a reset input R— and a reset input control signal B— are supplied to a NOR gate of the other of the two logic circuits. This can be equivalently shown in FIG. 18 in which the two NOR gates are connected respectively to the set input and reset input of the R-S flip flop (F/F), and such flip flop is operative only by the inputs that are supplied to the two respective NOR gates.

More specifically, the set input S— can pass through first NOR gate only when the set input control signal A— is at the low level L— and the reset input R— can pass through the other NOR gate only when the reset input control signal B— is at the low level L—. In this way, the R-S flip flop of the so-called clock synchronization kind can be realized by providing such prohibition gates. In the conventional prior art arrangement, four differential amplifiers are required because the R-S flip flop and the NOR gates must be individually constituted. Nevertheless, according to the present invention the R-S flip flop of the so-called clocksynchronization kind can be comprised of a relatively few number of circuit elements.

FIG. 19 shows the circuit diagram of an R-S flip flop that corresponds to the arrangement shown generally in FIG. 18, in which one logic circuit is comprised of transistors 42, 80, 44, and 66 and the other logic circuit is comprised of transistors 88, 90, 92, and 94. More specifically, one differential amplifier consists of transistor 42, 80, and 44 and the set input S— supplied at terminal 46 is fed to the base lead of transistor 42, and the set input control signal A— supplied to input terminal 84 is connected to the base lead of transistor 80. A second differential amplifier is made up of transistors 88, 90, and 92 and the reset input R— supplied to input terminal 94 is connected to the base lead of transistor 88 and the reset input control signal B— supplied to input terminal 96 is connected to the base lead of transistor 90. The collector output of transistor 44 is fed to the base lead of an emitter-follower transistor 66 and the emitter output thereof is supplied to the base lead of transistor 92. Similarly, the collector output of transistor 92 is fed to the base lead of a second emitter-follower transistor 94 and the output thereof is fed to the base lead of transistor 44. Therefore, the output $\overline{Q}$ is obtained from the emitter circuit of transistor 66 and the output Q is obtained from the emitter circuit of transistor 94. A constant current source to provide the inventive level shifting may be connected to the emitters of transistors 66 and 94, and the outputs having levels that are smaller by an amount ½ VL than the above described outputs Q and $\overline{Q}$ can be obtained.

The timing of the circuit of FIG. 19 is represented in FIG. 20, in which it is seen that when the set input S— that is fed in through input terminal 46 to the base of transistor 42 falls from the relatively high level H— to the relatively low level L— and the flip flop is reset and when the set input control signal A— is at the low level, transistors 42 and 80 are turned OFF and transistor 44 is turned ON, because the level L— is lower than the base potential L of transistor 44. Thus, output $\overline{Q}$ falls from the high level H to the low level L and transistor 92 of the second differential amplifier is turned OFF and transistors 88 and 90 are turned ON, whereby output Q rises from the low level L to the high level H. This state is the set state and is held even if the set input S— or set input control signal A— assumes the high level. When the reset input R—, which is fed in through input terminal 94 to the base of transistor 88 falls from the relatively high level H— to the low level L— in the set state and when the reset input control signal B— is at the low level L—, transistors 88 and 90 are turned OFF and transistor 92 is turned ON, because the level L— is lower than the base potential L of transistor 92. Thus, the output $\overline{Q}$ falls from the high level H to the low level L and transistor 44 of the first differential amplifier is turned OFF and transistors 42 and 80 are turned ON, whereby output Q rises from the low level L to the high level H. This reset state will be held even if the reset input R— or the reset input control signal B— assumes the high level H.

As may be seen then from the timing chart of FIG. 20, the R-S flip flop of FIG. 19 can be used as the so-called clock-synchronization R-S flip flop if the set input control signal A— and the reset input control signal B— are formed by a common clock input signal CK—. This configuration is represented schematically in FIG. 21.

A further example of an R-S flip flop that may be constituted using a single logic circuit according to the present invention is shown in FIG. 22. More particularly, a set input S can be supplied to both inputs of an OR gate, the reset input R— supplied to one input of a NOR gate, and the outputs of the OR gate and the NOR gate are both supplied to respective inputs of a second NOR gate. The output of such second NOR gate is then supplied as the second input to the first NOR gate, to which the reset input R— was supplied. In order to realize the configuration of the circuit of FIG. 22 a schematic of an embodiment of the present invention is shown in FIG. 23, in which transistors 44 and 82 comprise differential amplifiers and the collectors of these differential amplifiers are connected together. The set input S then is supplied to input terminal 46 and applied to the base lead of transistor 42 and the reset input R— supplied to input terminal 48 is applied to the base lead of transistor 44. The collector circuit of transistor 42 is connected to the voltage source at terminal 52 through a collector resistor 54, and the collector of transistor 42 is also connected to the base lead of output transistor 56, which is connected in the emitter-follower configuration. The emitter of transistor 56 is connected to the return line, which is connected at terminal 51 to relative ground potential, through series-connected resistors 58 and 60. At the node of resistors 58 and 60 is connected the base lead of transistor 82 and at this point also the output $\overline{Q}$ is also obtained. It should also be noted that the output could be taken directly from the emitter lead of transistor 56, and this will involve the appropriate voltage level shift.

The operation of the R-S flip flop circuit of FIG. 23 is represented in the timing chart of FIG. 24, in which it is seen that when the set input S rises from the low level L to the high level H while in the reset state, the output $\overline{Q}$— is at the relatively high level H—, and transistor 42 is turned ON and transistors 44 and 82 are turned OFF, because the high level H is greater than the relatively high level H—. Thus, the output $\overline{Q}$— falls from the relatively high level H— to the lowest level L—, and thereafter this state is held even if the set input S assumes the low level L. When the reset input R— rises from the lowest level L— to the relatively high level H— during the set state, transistor 44 is turned ON and transistor 42 is turned OFF, because the relatively high level H— is greater than the low level L. Therefore, output $\overline{Q}$— rises from the lowest level L— to the relatively high level H— and, thereafter, this state will be held even if the reset input R— assumes the low level L.

Referring back to the R-S flip flop circuit of FIG. 23, because this flip flop uses a single differential amplifier as the fundamental constructional element, the number of elements is minimized and, therefore, time delay due to collector capacitance of the transistors and the like is also held correspondingly small and, thus, the circuit of FIG. 23 provides high-speed operation.

A still further example of the present invention in which an R-S flip flop can be provided having multiple inputs and multiple outputs is shown in FIG. 25. In the circuit of FIG. 25, one differential amplifier is formed of two transistors 42 and 80 and the input signal S1 supplied at terminal 46 is applied to the base lead of transistor 42 and the other set input S2 supplied at input terminal 84 is applied to base lead of transistor 80. The collector leads of these two transistors forming the first differential amplifier are connected together in the known fashion. The second differential amplifier is formed from transistors 44 and 80 and reset input signal R— supplied at input terminal 48 is fed to the base lead of transistor 44 and the second reset signal R2— supplied to terminal 86 is fed to the base lead of transistor 82. Again, as in the conventional differential amplifier configuration, the collectors of transistors 44, 82, and 100 are connected together. The collector node of transistors 42 and 80 is connected to the power source input terminal 52 through resistor 54 and this collector node is also connected to the base lead of transistor 56 that is connected in the common-emitter configuration. More specifically, the emitter lead of transistor 56 is connected to relative ground potential at terminal 51 through series resistors 58 and 60. The collector node of transistors 44, 82, and 100 is connected to the power source terminal 52 through resistor 64, and this common collector node is also connected to the base lead of emitter-follower transistor 66. The emitter of transistor 66 is connected to relative ground potential through a series connection of resistors 68 and 102. The $\overline{Q}$— output is available at the node between resistors 58 and 60 of emitter-follower transistor 56 and this point is also connected to the base lead of transistor 100, which is part of the second differential amplifier. The output terminal 72A at which output Q is available is connected directly to the emitter of transistor 66, and the Q— output at terminal 72B is taken off at the node between series resistors 68 and 102. The R-S flip flop of FIG. 25 provides substantially the same operation is that of the R-S flip flop of FIG. 23 and is functionally represented in FIG. 26. Thus, in using the embodiment of FIG. 25, two outputs Q and Q— having a level difference of ½ VL are obtained.

Throughout the above embodiments, although a resistor or resistor combination has been employed as a constant circuit source, a constant current source arranged to apply a predetermined DC voltage between the base and emitter of the appropriate transistors could be utilized as well.

Although illustrative embodiments of the present invention have been described in detail above with reference to the accompanying drawings, it is to be understood that the invention is not limited to those precise embodiments, and that various changes and modifications can be effected therein by one skilled in the art without departing from the spirit and scope of the invention, as defined by the appended claims.

What is claimed is:

1. A logic circuit of the kind employing a differential amplifier having a plurality of transistors connected in a common emitter configuration, and a constant current source connected to said differential amplifier and a voltage source, comprising:

first input means connected to a base of a first one of said plurality of differential amplifier transistors for receiving a binary input signal having a preselected difference between high and low amplitudes thereof;

second input means connected to a base of a second one of said plurality of differential amplifier transistors for receiving a second binary input signal also having said preselected difference between high and low amplitudes thereof and being level shifted relative to said first input signal by an amount equal to ½ of said preselected difference; and output means connected to a collector of one of said differential amplifier transistors for producing output signals having amplitude levels responsive to said first and second binary input signals, with at least one of said output signals being level shifted by said ½ of said preselected difference to be available as said second binary input signal to a following logic circuit, whereby said output signals are obtained without a reference voltage being applied to said differential amplifier.

2. A logic circuit according to claim 1, in which said output means includes at least one emitter-follower configuration transistor providing said output signals.

3. A logic circuit according to claim 2, in which said emitter-follower transistor further includes resistance means connected in the emitter circuit thereof and said output signals being derived across said resistance means.

4. A logic circuit of the kind employing a differential amplifier having a plurality of transistors connected in a common emitter configuration, and a constant current source connected to said differential amplifier and a voltage source, comprising:

first input means connected to a base of a first one of said plurality of differential amplifier transistors for receiving a binary input signal having a preselected difference between high and low amplitudes thereof;

second input means connected to a base of a second one of said plurality of differential amplifier transistors for receiving a second binary input signal also having said preselected difference between high and low amplitudes thereof and being level shifted relative to said first input signal by an amount equal to ½ of said preselected difference; and output means connected to a collector of one of said differential amplifier transistors for producing output signals having amplitude levels responsive to said first and second binary input signals, with at least one of said output signals being level shifted by said ½ of said preselected difference, whereby said output signals are obtained without a reference voltage being applied to said differential amplifier;

in which said constant current source provides a preselected current I and said output means comprises an emitter-follower transistor having resistance means connected in the emitter circuit thereof and said resistance means has a resistance value selected to provide an output current of ½ I.

5. A logic circuit according to claim 1, further comprising resistance means connected between collectors of said differential amplifier transistors and said voltage source.

6. A logic circuit according to claim 5, in which said resistance means connected between said collectors and said voltage source is selected to have a value equal to ½ the value of a resistor forming said constant current source for said differential amplifier.

7. A logic circuit of the kind employing a differential amplifier having a plurality of transistors connected in a common emitter configuration, and a constant current source connected to said differential amplifier and a voltage source, comprising:

first input means connected to a base of a first one of said plurality of differential amplifier transistors for receiving a binary input signal having a preselected difference between high and low amplitudes thereof;

second input means connected to a base of a second one of said plurality of differential amplifier transistors for receiving a second binary input signal also having said preselected difference between high and low amplitudes thereof and being level shifted relative to said first input signal by an amount equal to ½ of said preselected difference; and output means connected to a collector of one of said differential amplifier transistors for producing output signals having amplitude levels responsive to said first and second binary input signals, with at least one of said output signals being level shifted by said ½ of said preselected difference, whereby said output signals are obtained without a reference voltage being applied to said differential amplfier;

in which said output means includes a resistor and an output transistor, said resistor being connected from the base of said output transistor to relative electrical ground.

8. A logic circuit according to claim 7, in which the value of said resistor connected to said base of said output transistor is substantially ½ the value of the resistance of a resistor forming said constant current source for said differential amplifier.

9. A logic circuit according to claim 1, in which said differential amplifier comprises four transistors arranged into first and second pairs for receiving respective first and second pairs of input binary signals from said first and second input means, respectively, and in which said first and second pairs of binary input signals have a preselected relationship between high and low amplitudes thereof, and in which a second one of each of said first and second pairs of input signals is shifted relative to a first one of each pair by an amount equal to ½ said preselected amplitude difference.

10. A logic circuit according to claim 1, in which said differential amplifier comprises two groups of three transistors, each group forming a respective differential amplifier, the outputs of the two differential amplifiers being connected as inputs to a third transistor of each group and the other two transistors of each group being provided with respective input binary signals from said first and second input means, thereby providing a controlled input flip flop logic circuit.

11. A logic circuit according to claim 10, in which said output means has a level shifting resistor connected in the collector circuit of said third transistor of each of said two differential amplifiers.

12. A logic circuit according to claim 10, in which said output means comprises two output transistors and includes a level shifting resistor connected in the respective emitter circuit of said two output transistors.

13. A logic circuit according to claim 1, further comprising an additional transistor having an emitter connected to said common emitters, a collector connected to said collector to which said output means is connected, and a base connected to one of said output signals from said output means, thereby forming a flip flop logic circuit.

14. A logic circuit according to claim 13, in which said differential amplifier comprises two groups of respective pairs of transistors and said first input means provides two input signals connected to respective transistors of said first group and said second input means provides two input signals connected to respective transistors of said second group of transistors and said additional transistor is connected to receive one of said output signals as an input signal thereof.

15. A logic circuit according to claim 14, in which said output means comprises an output emitter-follower transistor having at least one resistor connected in the emitter circuit thereof.

16. A logic circuit according to claim 15, in which said output emitter-follower transistor includes two resistors in the emitter circuit thereof, thereby providing two output signals.

17. A method of operating a logic circuit of the kind employing a differential amplifier having at least two differential transistors, a binary input signal being connected to a base lead of each of said two differential transistors, and a constant current source connected between a voltage source and the differential transistors, and in which an output signal is taken from a collector circuit of one of the differential transistors, comprising the steps of providing first and second binary input signals with the same preselected amplitude difference between low levels and high levels thereof, and level shifting one of said first and second binary input signals relative to the other by an amount equal to ½ of said preselected amplitude difference, providing corresponding output signals having said same preselected amplitude difference, and level shifting one of said output signals relative to the other by an amount equal to ½ said preselected amplitude difference to provide an output signal having a level corresponding to a level of said second binary input signal and available as said second binary input signal to a following logic circuit.

18. A method according to claim 17, in which the output signal is formed by providing an emitter-follower transistor and connecting two resistors in the emitter circuit thereof, thereby forming two output signals shifted relative to each other by an amount equal to ½ of said preselected amplitude difference.

19. A method of operating a logic circuit of the kind employing a differential amplifier having at least two differential transistors, a binary input signal being connected to a base lead of each of said two differential transistors, and a constant current source connected between a voltage source and the differential transistors, and in which an output signal is taken from a collector circuit of one of the differential transistors, comprising the steps of providing first and second binary input signals with the same preselected amplitude difference between low levels and high levels thereof, and level shifting one of said first and second binary input signals relative to the other by an amount equal to ½ of said preselected amplitude difference, providing corresponding output signals having said same preselected amplitude difference, and level shifting one of said output signals relative to the other by an amount equal to ½ said preselected amplitude difference;

further comprising the step of forming the output signal by connecting a constant current source resistor in the collector circuit of one of the differential amplifier transistors and selecting said constant current source resistor to have ½ the value of a resistor forming the constant current source for said two differential transistors.

20. A method of operating a logic circuit of the kind employing a differential amplifier having at least two differential transistors, a binary input signal being connected to a base lead of each of said two differential transistors, and a constant current source connected between a voltage source and the differential transistors, and in which an output signal is taken from a collector circuit of one of the differential transistors, comprising the steps of providing first and second binary input signals with the same preselected amplitude difference between low levels and high levels thereof, and level shifting one of said first and second binary input signals relative to the other by an amount equal to ½ of said preselected amplitude difference, providing corresponding output signals having said same preselected amplitude difference, and level shifting one of said output signals relative to the other by an amount equal to ½ said preselected amplitude difference;

in which the step of level shifting one of said output signals includes providing a constant current source for an output transistor having a value ½ of the value of the constant current of said differential amplifier.

* * * * *